United States Patent [19]
Morse

[11] 3,934,336
[45] Jan. 27, 1976

[54] ELECTRONIC PACKAGE ASSEMBLY WITH CAPILLARY BRIDGING CONNECTION

[75] Inventor: Robert S. Morse, La Mesa, Calif.

[73] Assignee: Burroughs Corporation, Detroit, Mich.

[22] Filed: Jan. 13, 1975

[21] Appl. No.: 540,579

[52] U.S. Cl. ............ 29/627; 174/52 FP; 174/68.5; 317/101 CP; 29/588
[51] Int. Cl.[2] .................. H05K 3/10; H05K 3/30
[58] Field of Search ........... 174/52 S, DIG. 3, 68.5; 317/101 A, 101 CP, 101 C; 117/169, 95, 212, 213, 215; 29/626, 627, 588–591

[56] References Cited
UNITED STATES PATENTS

| | | | |
|---|---|---|---|
| 3,316,458 | 4/1967 | Jenny | 317/101 CP UX |
| 3,728,469 | 4/1973 | Rybarczk | 174/52 S |
| 3,760,090 | 9/1973 | Fowler | 174/52 S |

*Primary Examiner*—Darrell L. Clay
*Attorney, Agent, or Firm*—Alan Petlin Klein; William B. Penn; Kevin R. Peterson

[57] ABSTRACT

An electronic package assembly comprising a substrate having a central recess in which a semiconductor chip can be mounted. A narrow inclined groove is cut into the edge of the recess and extends from the recess bottom to the location of a screen-printed ground lead on the surface of the substrate. Conductive paste is painted on the bottom of the recess for attachment of a chip and a portion of the paste is drawn up the groove by capillary action to form a tenacious bond with the screen-printed ground lead.

3 Claims, 4 Drawing Figures

GOLD-GLASS CONDUCTIVE MATERIAL

GOLD-GLASS CONDUCTIVE MATERIAL

ELECTRONIC PACKAGE ASSEMBLY WITH CAPILLARY BRIDGING CONNECTION

BACKGROUND OF THE INVENTION

1. Field of the Invention

This invention relates to an electronic package assembly of the type having an encapsulated device, and also to methods for assembling such packages. More particularly, the invention relates to electrical interconnection of an external package lead to the device mounting pad of such an electronic assembly.

2. Description of the Prior Art

In the microelectronic device art, it is known to encapsulate silicon chip integrated circuits in a recess formed in a surface of a ceramic package substrate. A pattern of electrical leads is screen printed with conducting ink or paint onto the substrate surface and arranged to provide interconnecting paths between respective terminals of the integrated circuit and the external package leads. The mounting of the silicon chip within the recess is facilitated by painting over the lower portion of the recess a bonding material which can adhere to both the bottom of the chip and the bottom portion of the recess with which it makes contact. If a conventional gold-glass binder coating or pad is used, the device mounting step, in addition to mechanically securing the chip in the package, provides an electrically conductive connection to the base of the chip. This also allows the heat generated in the integrated circuit to be dissipated by conduction into the package.

Before mounting the silicon chip within the recess, the screen printed conductor mating with the external package ground lead is electrically connected to the device mounting pad. This provides the ground connection to the encapsulated device. The chip is then attached to the pad and the terminal points of the integrated circuit are wire-bonded to respective interconnecting paths on the surface of the ceramic package substrate. The last step in the fabrication of the electronic package assembly comprises attaching a lid over the substrate so as to hermetically seal the silicon chip within the package.

In the prior art, considerable difficulty has been encountered in making a sturdy and reliable ground lead connection between the screen printed conductor on the surface of the package substrate and the device mounting pad at the bottom of the recess. Present techniques, such as screen printing down the step between the substrate surface and the recess, or wire-bonding, provide a low yield of acceptable devices in a mass production operation, in addition to requiring a separate time consuming and costly operation in the fabrication of the package.

SUMMARY

A preferred embodiment of the present invention is achieved by providing an inclined capillary groove running up the wall of the device mounting recess, one end of which terminates at the location of the screen printed ground lead on the surface of the substrate. The gold-glass binder coating overlies a portion of the capillary. The flow characteristics of the coating are such that a portion is drawn up the groove by capillary action to form a tenacious, low impedance interconnection with the ground lead.

It is therefore an object of this invention to provide an electronic package assembly having an improved and reliable electrical interconnection between the ground conductor on the package substrate and the pad within the device mounting recess.

It is a further object of this invention to provide an electronic package assembly wherein such interconnection can be accomplished without the need for a separate step in the fabrication of the assembly.

It is an additional object to provide an electronic package assembly wherein the pad within the device mounting recess and the connection to the ground conductor on the package substrate are formed in a single operation.

It is yet another object to provide an electronic package assembly wherein such interconnection can be made without the need for a time consuming and costly operation in the fabrication of the assembly.

Other objects and advantages of the invention will become more fully apparent from the following detailed description of the preferred embodiment taken in conjunction with the appended claims and accompanying drawings.

DETAILED DESCRIPTION

Figure 1:
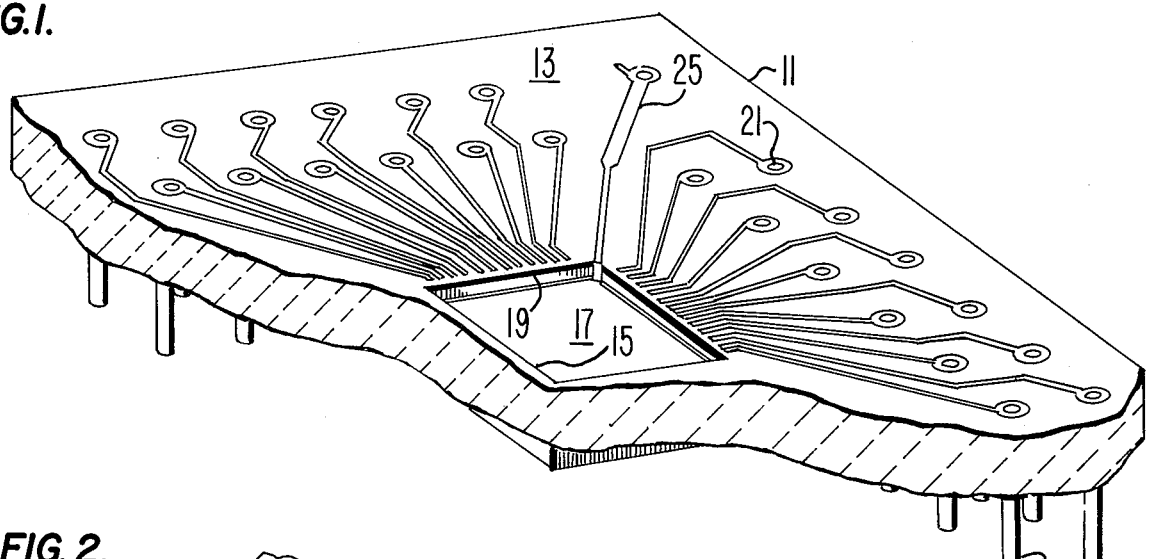
FIG. 1 shows an isometric view of a representative electronic package assembly with which the inventive capillary bridging connection can be advantageously used.

FIG. 1 shows a conventional electronic package assembly constructed from a planar ceramic substrate 11 having located in a surface 13 thereof a central recess 15 in which a semiconductor chip can be mounted. The recess 15 consists of a horizontal bottom surface 17 and vertically extending side walls 19. The substrate 11 also contains an array of holes 21 with each hole receiving an external electrical lead pin 23. The lead pins 23 are secured in the package and a conductive pattern of leads, such as 25, are screen printed on the surface 13 of the substrate 11 to interconnect the pins 23 to the semiconductor device. To facilitate attachment of the semiconductor device within the recess 15, a layer of viscous gold-glass binder bonding material, constituting the device mounting pad 27, is applied on the bottom surface 17 and at least a portion of the walls 19 of the recess 15.

The gold-glass binder bonding material can be formulated by admixing powdered gold and glass frit with an organic carrier vehicle consisting of a solvent and binder. The admixture is thoroughly blended into a paste and applied to the recess by drop or screen printing techniques. The paste is then heated to a relatively low temperature (e.g., about 100°–200°C) to remove the solvent and then to a higher temperature (i.e., the firing temperature) to remove the binder portion of the organic carrier vehicle and cause the glass binder to flow and the gold to sinter so as to form a solid, organic-free pad or coating.

The glass binder is employed to provide flow characteristics to the coating and to provide good adhesion with the ceramic substrate or further intermediate bonding material. Gold is employed, on the other hand, to provide good adhesion, often through formation of a eutectic, with the semiconductor device and to make the paste conductive.

A particularly suitable gold-glass binder bonding material useful to effect the purposes of this invention is a paste known as Gold Dot No. 2753 supplied by Plessey of Los Angeles, Calif., and consisting of from 50 to 55 percent by weight of gold, from 1 to 2 percent by weight of a glass binder, and from 43 to 49 percent by weight of an organic carrier vehicle.

The ceramic material of the substrate may be alumina or any of the conventional and well-known materials such as steatite, forsterite, cordierite, porcelain, mullite, zircona and the like.

In the embodiment shown, the depth of the recess is about 0.025 inches. The thickness of the device mounting pad is about 0.015 inches. The width of the conductive leads on the surface of the substrate is about 0.020 inches.

In the prior art, considerable difficulty was encountered in making a good electrical ground lead connection to the device mounting pad. If screen printing techniques are employed this requires that ink be applied up to the edge of the recess and then down the side walls of the recess and across the bottom. It will be appreciated that this requires two right angle turns, and that frequently the ink or paint at the abrupt corners tends to peel back in both directions breaking the conductive path.

Figure 2:
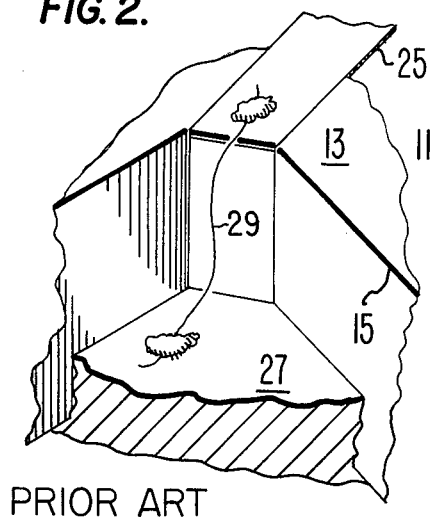
FIG. 2 illustrates an enlarged partial isometric view of the structure of FIG. 1 after the wire-bonding operation has been carried out in accordance with teachings of the prior art.

FIG. 2 illustrates a practice of the prior art in using a short connection wire 29 to bridge between the device mounting pad 27 on the bottom of the recess 15 and the screen printed ground lead 25 on the surface 13 of the substrate 11. The wire is bonded to the conductor and the pad by conventional thermocompression bonding. Often the bond at either end of the wire is imperfect and the connection is susceptible to breakage.

Figure 3:
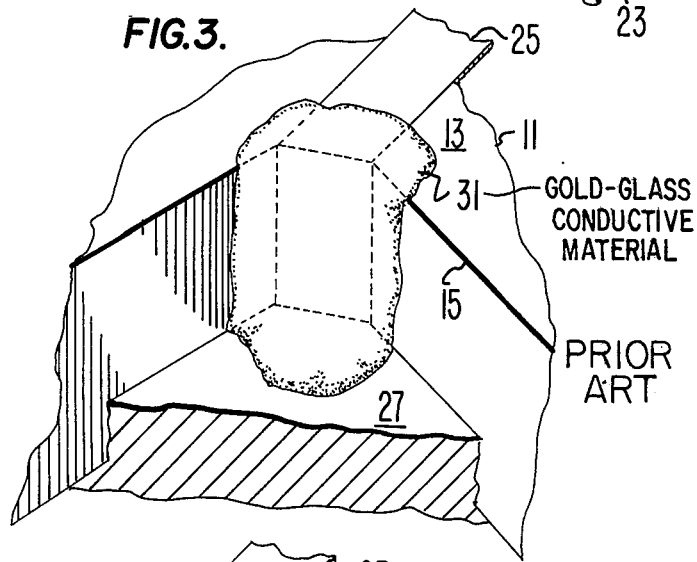
FIG. 3 illustrates an enlarged partial isometric view of the structure of FIG. 1 after application of a dot of gold-glass binder material also in accordance with teachings of the prior art.

FIG. 3 illustrates yet another practice of the prior art in which a dot 31 of gold-glass binder material is applied to the step between the pad 27 and the surface 13 of the substrate 11 by drop techniques so as to provide the desired conductive path between the pad and the ground conductor. The application of the paste requires a separate operation by a technician using a microscope. If the drop is not applied carefully, or an excess amount is applied, the paste can short out other conductors on the surface of the substrate, and the package must be scrapped. Also, if an insufficient amount of paste is used, upon drying, the paste may pull away in both directions breaking the connection and requiring a new coat of paste. In fact, the broken connection may go unnoticed and cause the package to fail in final testing.

Figure 4:
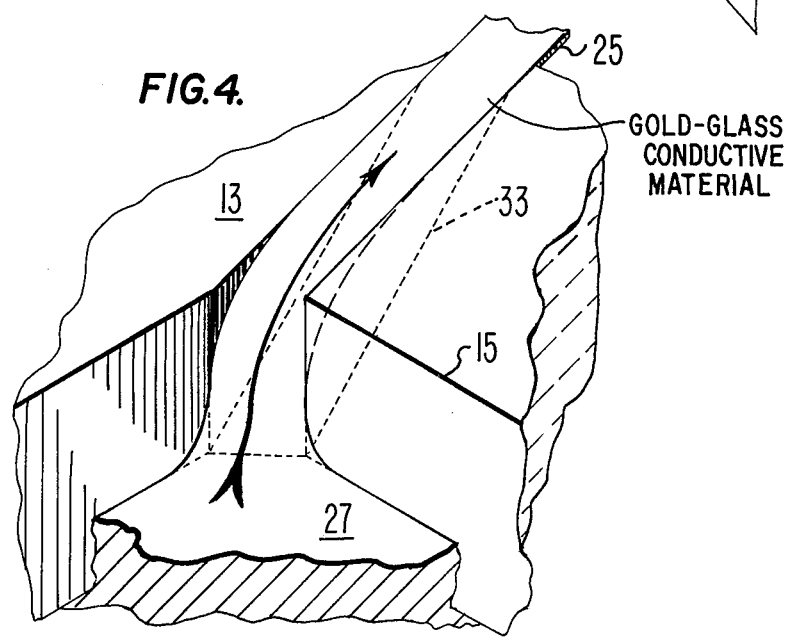
FIG. 4 illustrates an enlarged partial isometric view of the structure of FIG. 1 after the capillary bridging operation has been carried out in accordance with the present invention.

Referring now to FIG. 4, there is shown a way of overcoming the drawbacks of the prior art while providing a sound electrical bond from the device mounting pad on the bottom of the recess to the screen printed ground conductor on the substrate surface. In the preferred embodiment, a narrow inclined groove 33 having a width of about 0.010 inches and a length of about 0.050 inches is cut into the edge of the recess 15 at a location contiguous to the screen printed ground lead 25 terminal. The groove provides a 30° grade from the bottom of the recess to the surface of the substrate without any abrupt corners.

When the gold-glass binder bonding material is applied to the bottom of the recess in paste form to form the mounting pad, the paste tends to wet the walls of the recess. The forces of cohesion exerted by the molecules of the paste and the forces of adhesion exerted by the molecules of the walls cause the surface of the paste within the recess to curve up and a large meniscus forms on the walls. This meniscus remains during heating to remove the solvent and during heat up to the firing temperature. The concave meniscus also forms within the lower portion of the groove which is covered by the gold-glass binder material. As is well-known, the surface tension of a liquid exerts a force tending to reduce the surface area of the liquid. Thus, an upward "surface tension" force appears where the surface of the gold-glass binder material makes contact with the groove. By reason of the small cross section of the groove the force of gravity on the liquid therein is easily overcome and capillary rise can occur. The flow of gold-glass binder material up the groove creates the desired conducting path and a tenacious low impedance connection between the screen printed ground conductor on the surface of the substrate and the device mounting pad, without the need for a separate operation in the fabrication of the electronic package assembly.

It is understood that the illustrated embodiment is by no means exhaustive of the device recess designs which could be employed, and that other noble metal-glass binder compositions can be used in the reduction to practice of the invention. It will be apparent that various modifications and other embodiments thereof will occur to those skilled in the art and it is desired that the scope of the invention be limited by the appended claims only.

What is claimed is:

1. A method of assembling an electronic package enclosing a microelectronic device mounted on a substrate having a plurality of electrically conductive leads thereon and a recess formed therein with a capillary groove cut into the wall of said recess and leading from said recess to terminate at one of said plurality of electrically conductive leads, comprising the steps of:

applying a layer of hardenable conductive material to the bottom of said recess and to at least a portion of the wall of said groove adjacent to the bottom of said recess causing upward flow of said hardenable conductive material by capillary action in said groove into contact with said one conductive lead before hardening;

hardening said hardenable conductive material resulting in said conductive material forming a tenacious bond with said one of said plurality of electrically conductive leads;

bonding a microelectronic device to said layer of conductive material on the bottom of said recess;

interconnecting the terminals of said microelectronic device to at least some of said conductive leads; and encapsulating said microelectronic device.

2. The method of claim 1 wherein the applying step comprises applying a layer of hardenable gold-glass binder bonding material to the bottom of said recess and at least a portion of the wall of said groove adjacent to the bottom of said recess causing upward flow of said gold-glass binder bonding material by capillary action in said groove into contact with said one conductive lead before hardening; and the hardening step comprises firing the gold-glass binder bonding material resulting in said gold-glass binder bonding material forming a tenacious bond with said one of said plurality of electrically conductive leads.

3. A method of assembling an electronic package for enclosing a microelectronic device mounted on a substrate comprising the steps of:

forming a device mounting recess in said substrate;

locating a plurality of conductive leads on said substrate;

cutting a capillary groove into the wall of said recess and leading from said recess to terminate at one of said plurality of electrically conductive leads;

applying a layer of hardenable conductive material to the bottom of said recess and to at least a portion of the wall of said groove adjacent to the bottom of said recess causing upward flow of said conductive material by capillary action in said groove into contact with said one conductive lead before hardening; and hardening said hardenable conductive material resulting in said conductive material forming a tenacious bond with said one of said plurality of electrically conductive leads.

\* \* \* \* \*